(12) United States Patent
Koh et al.

(10) Patent No.: US 11,159,041 B2
(45) Date of Patent: Oct. 26, 2021

(54) COMMUNICATION SYSTEM IN VEHICLE AND COMMUNICATION METHOD USING THE SAME

(71) Applicant: HYUNDAI TRANSYS INC., Seosan-si (KR)

(72) Inventors: Sang Kyung Koh, Yongin-si (KR); Jong In Shin, Hwaseong-si (KR); Sang June Lee, Hwaseong-si (KR); Woong Jae Lee, Hwaseong-si (KR)

(73) Assignee: HYUNDAI TRANSYS INC., Seosan-si (KR)

( * ) Notice: Subject to any disclaimer, the term of this patent is extended or adjusted under 35 U.S.C. 154(b) by 0 days.

(21) Appl. No.: 16/692,736

(22) Filed: Nov. 22, 2019

(65) Prior Publication Data
US 2020/0203983 A1    Jun. 25, 2020

(30) Foreign Application Priority Data
Dec. 20, 2018    (KR) .................... 10-2018-0166793

(51) Int. Cl.
*H02J 7/24* (2006.01)
*H03K 7/08* (2006.01)
*H04L 25/49* (2006.01)

(52) U.S. Cl.
CPC ............ *H02J 7/243* (2020.01); *H02J 7/2434* (2020.01); *H03K 7/08* (2013.01); *H04L 25/4902* (2013.01)

(58) Field of Classification Search
CPC ............ H02J 7/22; H02J 7/243; H02J 7/2434; H03K 7/04; H03K 7/08; H03K 9/04;
(Continued)

(56) References Cited

U.S. PATENT DOCUMENTS 9,793,817 B2 * 10/2017 Choi ................. H02M 3/33561
2010/0280634 A1 * 11/2010 Murashige .............. H04L 67/12
700/82
(Continued)

FOREIGN PATENT DOCUMENTS

JP      2011-168210 A    9/2011
JP      2014-154043 A    8/2014
(Continued)

OTHER PUBLICATIONS

Office Action received for Korean Patent Application No. 10-2018-0166793, dated Oct. 19, 2020, 15 pages (8 pages of English Translation and 7 pages of Office Action).

*Primary Examiner* — Young T. Tse
(74) *Attorney, Agent, or Firm* — Womble Bond Dickinson (US) LLP

(57) ABSTRACT

A communication system in vehicle according to an aspect includes a transmission unit and a receiving unit. The transmission unit includes a modulation unit that generates a PWM signal having a predetermined duty ratio, an output unit that outputs the PWM signal, a feedback unit that feedbacks the PWM signal, and a transmission controller that controls the modulation unit using the feedbacked signal. The receiving unit includes a reception controller that determined whether to drive a load based on the PWM signal and a switching unit that is turned on or turned off based on the determination of the reception controller.

10 Claims, 5 Drawing Sheets

(58) Field of Classification Search
CPC ... H03K 9/08; H04B 1/38; H04B 1/40; H04B 1/48; H04L 25/40; H04L 25/4902
USPC ......... 375/219–222, 237, 238, 257; 370/212, 370/213; 329/312, 313; 332/109, 112; 701/58, 61, 70
See application file for complete search history.

(56) References Cited

U.S. PATENT DOCUMENTS

| | | | | |
|---|---|---|---|---|
| 2011/0084656 | A1* | 4/2011 | Gao | H02J 50/12 |
| | | | | 320/108 |
| 2012/0082204 | A1* | 4/2012 | Iwano | G08C 19/02 |
| | | | | 375/238 |
| 2013/0328520 | A1* | 12/2013 | Chen | H02M 1/32 |
| | | | | 320/107 |
| 2015/0330116 | A1* | 11/2015 | Dente | E05B 77/12 |
| | | | | 307/10.1 |
| 2018/0083477 | A1* | 3/2018 | Tian | H02M 5/04 |
| 2020/0083874 | A1* | 3/2020 | Zhuo | H02M 3/33523 |

FOREIGN PATENT DOCUMENTS

| | | |
|---|---|---|
| KR | 10-2004-0081176 A | 9/2004 |
| KR | 10-2017-0114148 A | 10/2017 |

* cited by examiner

COMMUNICATION SYSTEM IN VEHICLE AND COMMUNICATION METHOD USING THE SAME

CROSS-REFERENCE TO RELATED APPLICATIONS

This application claims the benefit under 35 U.S.C. 119(a) of Korean Patent Application No. 10-2018-0166793 filed on Dec. 20, 2018 in the Korean Intellectual Property Office, the entire disclosure of which is incorporated herein by reference for all purposes.

BACKGROUND

Field

The present disclosure relates to a communication system in vehicle and a communication method using the same. The present disclosure also relates to a communication system in vehicle that performs Pulse Width Modulation (PWM) communication and a communication method using the same.

Description of the Related Art

The relate art used a lot of wirings to deliver active high/low signals in vehicle, and for its reduction, Local Interconnect Network (LIN) and Controller Area Network (CAN) communication methods have been proposed.

In the CAN communication method, two wires are used. Using two wires increases the complexity of the structure. In the LIN communication method, the communication is carried out using a fixed timetable, and there are master and slave and it does not work if the master does not exist.

However, for the CAN or LIN communication methods, protocols are complicated and a high-quality Micro Controller Unit (MCU) and transceiver are required, so they cost a lot compared to one-way communication.

SUMMARY

The following description is provided to solve the above-mentioned problems and propose a communication system in vehicle and a communication method using the same that can replace CAN/LIN communication methods and can be implemented cost-effectively.

A communication system in vehicle according to an aspect includes a transmission unit and a receiving unit. The transmission unit includes a modulation unit configured to generate a PWM signal having a predetermined duty ratio; an output unit configured to output the PWM signal; a feedback unit configured to feedback the PWM signal to the transmission unit; and a transmission controller configured to control the modulation unit by using a signal feedbacked. The receiving unit includes a reception controller configured to determine whether to drive a load based on the PWM signal; and a switching unit configured to turn on or turn off based on determination of the reception controller.

If the PWM signal is abnormal, the transmission controller may control the modulation unit to generate PWM signal that remains high for a predetermined time, and the reception controller may maintain the switching unit as turn-on state for a predetermined time.

When determining whether the PWM signal is normal, the transmission controller may determine the PWM signal as abnormal if the signal feedbacked has a duty ratio that is not defined beforehand.

The communication system in vehicle may include the receiving unit in multiple numbers, and the transmission unit generates and transmits a plurality of PWM signals having different duty ratios to each receiving unit.

The duty ratio predetermined may be set to instruct operation of the load.

A communication method in vehicle according to another aspect includes generating a PWM signal having a predetermined duty ratio in a modulation unit; outputting the PWM signal in an output unit; feedbacking the PWM signal to a transmission unit to a feedback unit; verifying, by a transmission controller, whether the PWM signal is normal using signal feedbacked; and controlling, by the transmission controller, the modulation unit based on verification result.

In the verifying step, the transmission controller may determine the PWM signal abnormal if the signal feedbacked has a duty ratio not defined beforehand.

In the controlling step, if the PWM signal is abnormal, the transmission controller may control the modulation unit to generate PWM signal remaining high for a predetermined time.

The communication method in vehicle may further include driving, by a reception controller, a load based on the PWM signal. If the PWM signal is abnormal, the reception controller may control the switching unit to maintain turn-on state for a predetermined time.

The communication method in vehicle may include a plurality of receiving units. In the generating step, the modulation unit may generate a plurality of PWM signals having different duty ratios.

The predetermined duty ratio may be set to instruct operation of a load driven by receiving unit.

A communication system in vehicle and a communication method using the same according to the present disclosure carry out communication using PWM signals, so an expensive MCU supporting CAN/LIN communications is not required; they can be economically implemented.

In addition, according to the present disclosure, as it determines whether PWM signal is normal and performs control actions based thereon, a system on a receiving unit's side is not influenced even in case communication errors occur.

DETAILED DESCRIPTION

Figure 1:
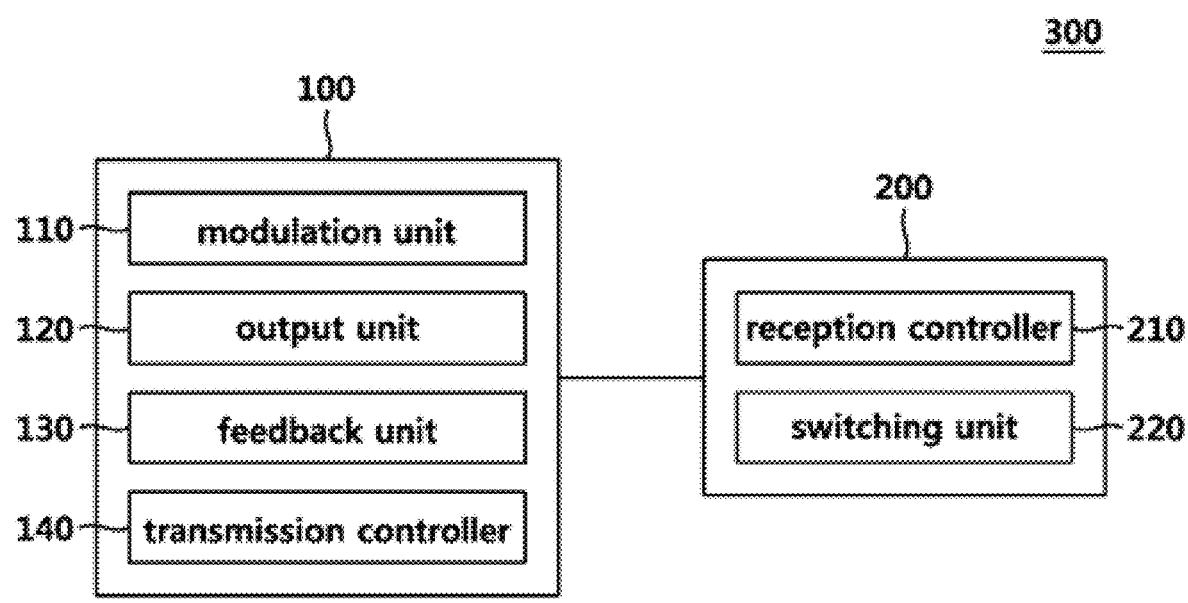
FIG. 1 is a view illustrating an example of structure of a communication system in vehicle.

As the following disclosure allows for various changes and numerous embodiments, particular embodiments will be illustrated in the drawings and described in detail in the written description. However, this is not intended to limit the present disclosure to specific embodiments, it should be understood to include all changes, equivalents, and substitutes included in the spirit and scope of the present disclosure.

In describing each drawing, like reference numerals are used for like elements. Terms such as first and second may be used to describe various components, but the components should not be limited by the terms. The terms are used only for the purpose of distinguishing one component from another.

For example, without departing from the scope of the present invention, the first component may be referred to as the second component, and similarly, the second component may also be referred to as the first component. The term "and/or" includes any combination of a plurality of related items or any item of a plurality of related items.

Unless defined otherwise, all terms used herein, including technical or scientific terms, have the same meaning as commonly understood by one of ordinary skill in the art.

Terms such as those defined in the commonly used dictionaries should be construed as having meanings consistent with the meanings in the context of the related art and shall not be construed in ideal or excessively formal meanings unless expressly defined in this application.

Hereinafter, a communication system in vehicle and a communication method using the same according to an example will be described in detail with reference to the accompanying drawings.

FIG. 1 is a view illustrating an example of structure of a communication system in vehicle.

A communication system in vehicle 300 according to an example performs Pulse Width Modulation (PWM) communication to control all kinds of functions in vehicle. Referring to FIG. 1, the communication system in vehicle 300 includes a transmission unit 100 and a receiving unit 200.

The transmission unit 100 generates and transmits a PWM signal for controlling each function in vehicle to the receiving unit 200. In detail, the transmission unit 100 may include a modulation unit 110, an output unit 120, a feedback unit 130, and a transmission controller 140.

The modulation unit 110 generates a PWM signal having a duty ratio determined beforehand. In detail, the modulation unit can generate a PWM signal having a duty ratio set to control a load driven by the receiving unit 200. The load may include a seat, a heater, and an air conditioning in vehicle but it is not limited thereto, and it may include all of other electronic devices that operate by communication in vehicle.

One example of the duty ratio and load operation based thereon is shown in Table 1.

TABLE 1

| Duty ratio (%) | Operation |
| --- | --- |
| 10 | Seat ventilation - level 1 |
| 20 | Seat ventilation - level 2 |
| 30 | Seat ventilation - level 3 |
| 50~60 | OFF |
| 70 | Seat heating system - level 1 |
| 80 | Seat heating system - level 2 |
| 90 | Seat heating system - level 3 |

The output unit 120 outputs the PWM signal. In detail, the output unit 120 outputs a PWM signal generated by the modulation unit 110 to the receiving unit 200. The output unit 120 may include two switching devices to implement the signal generated by the modulation unit 110. The details will be provided later. The feedback unit 130 feedbacks the PWM signal to the transmission unit 100. In detail, the output unit 120 outputs the PWM signal to the receiving unit 200, and the feedback unit 130, while being connected to the output unit 120, feeds back a part of the PWM signal output to the receiving unit to the transmission unit.

The transmission controller 140 controls the modulation unit 110 by using a signal that the feedback unit 130 transmits. In detail, the transmission controller 140 determines whether the PWM signal is normal by using the signal feedbacked by the feedback unit 130. The transmission controller 140 controls the modulation unit 110 based on the determination result.

If the PWM signal is normal, the PWM signal is output as it is. The transmission controller 140 controls the modulation unit 110 to maintain operations.

The transmission controller 140 determines the PWM signal as abnormal if the feedbacked signal has a duty ratio not defined beforehand. The duty ratio not defined beforehand means a duty ratio that is not defined to instruct operations of a load driven by the receiving unit 200 as shown in Table 1.

For example, the operation for a case where the duty ratio is 40% is not defined in Table 1. The transmission controller 140 may determine a PWM signal with 40% duty ratio as abnormal.

If the PWM signal is abnormal, the transmission controller 140 controls the modulation unit 110 to generate a PWM signal that remains high for a predetermined time period. The predetermined time period refers to a commonly defined time so that the receiving unit 200 recognizes that a PWM signal is abnormal and performs an operation based thereon.

The duration of the predetermined time period may be set as specific values considering the transmission unit 100, receiving unit 200, a specification of the load driven by the receiving unit 200, and efficiency of communication.

According to one example, if the PWM signal is abnormal, the transmission controller 140 can control the modulation unit 110 to generate a PWM signal that remains low for a predetermined time period.

According to one example, if the PWM signal is abnormal, the transmission controller 140 can control the modulation unit 110 to generate a signal again after it is reset.

The receiving unit 200 determines whether the load is driven, based on a PWM signal that is output by the transmission unit 100. In detail, the receiving unit 200 may include a reception controller 210 and a switching unit 220.

The reception controller 210 determines whether to drive the load based on the PWM signal. The switching unit 220 is turned on or turned off based on the determination of the reception controller 210.

In detail, if the PWM signal is normal, the reception controller 210 controls that the load operates depending on the PWM signal.

If the PWM signal is abnormal, the reception controller 210 controls the switching unit 220 so that the load does not operate based on the PWM signal. In detail, the reception controller 210 can control so that the switching unit 220 remains a turn-on state or turn-off state.

As above, a communication system in vehicle 300 according to one example performs communication using PWM signal, so it can be implemented cost-effectively since an expensive MCU that supports CAN/LIN communications is not required.

Also, as the communication system determines the normality of PWM signal and performs control actions based thereon, it does not give influence to the operation of load driven by the receiving unit 200 even if communication errors occur.

Figure 2:
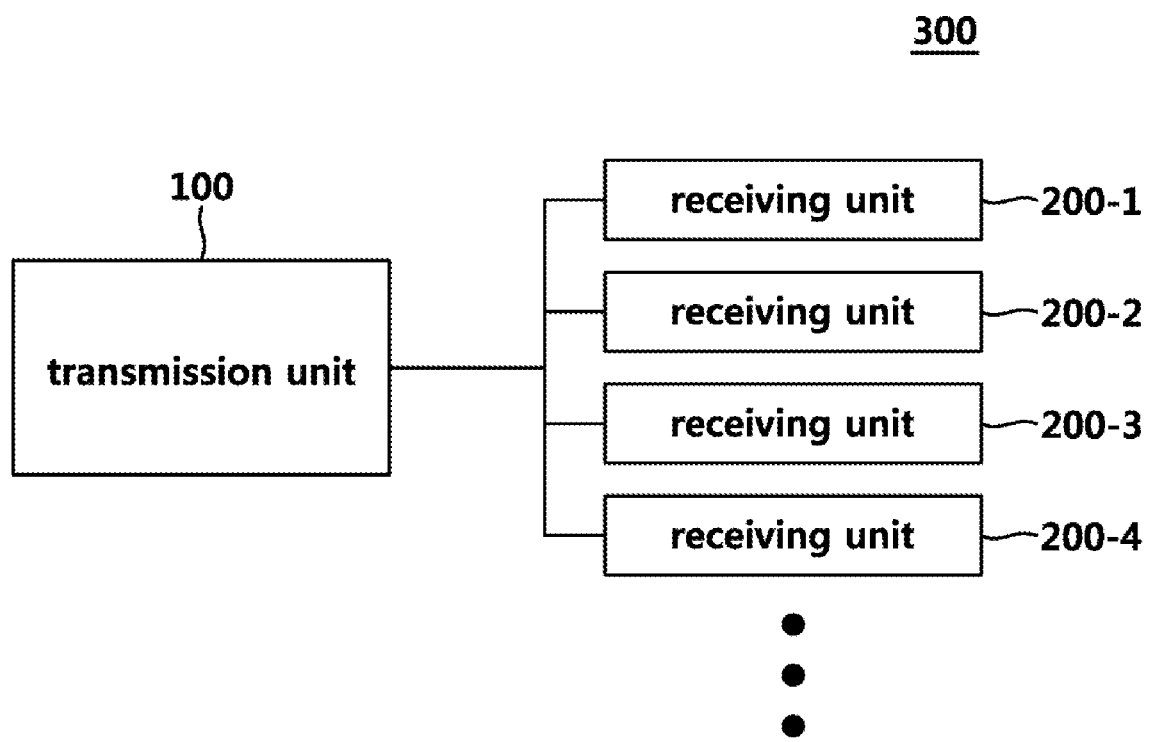
FIG. 2 is a view illustrating an example of structure of a communication system in vehicle including a plurality of receiving units.

FIG. 2 is a view illustrating an example of structure of a communication system in vehicle including a plurality of receiving units.

Referring to FIG. 2, a communication system in vehicle 300 according to one example may include a plurality of receiving units 200.

A plurality of receiving units 200-1, 200-2, 200-3, 200-4, and so on, operate a load driven by themselves by receiving a PWM signal transmitted by a transmission unit 100. For example, the receiving unit 200-1 drives a fan for seat ventilation, the receiving unit 200-2 drives heating system of seats, the receiving unit 200-3 drives air conditioning system, and the receiving unit 200-4 drives a radio.

As described above, the communication system 300 according to one example can control a plurality of devices in vehicle by transmitting a signal to a plurality of receiving units 200-1, 200-2, 200-3, 200-4, and so on, via one transmission unit 100.

Figure 3:
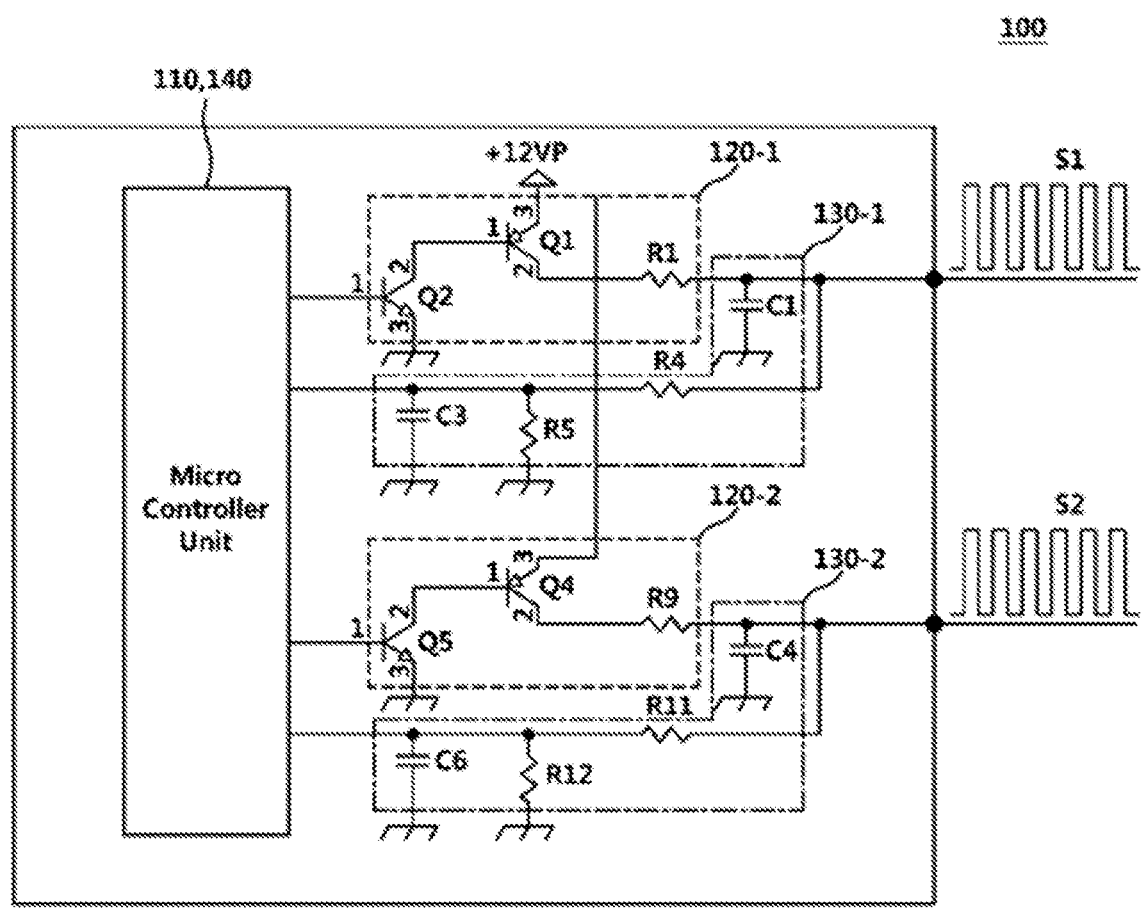
FIG. 3 is a view illustrating an example of structure of a transmission unit that transmits signals for two receiving units.

FIG. 3 is a view illustrating an example of structure of a transmission unit that transmits signals for two receiving units.

If there are a plurality of receiving units 200, a transmission unit 100 may transmit PWM signals having different duty ratios for each receiving unit 200.

In detail, referring to FIG. 3, assuming that there are two receiving units 200, the transmission unit 100 may be set to include output units 120-1, 120-2 and feedback units 130-1, 130-2 so that they correspond to each receiving unit 200. A modulation unit 110 and a transmission controller 140 may be implemented with Micro Controller Unit (MCU).

The operation of a circuit is described on the basis of the output unit 120-1 as follows.

1) Case in which modulation unit 110 generates a signal having high state
   A base voltage is supplied to a base terminal of a transistor Q2 with high voltage, and a base voltage of a base terminal of a transistor Q1 becomes low. The transistor Q1 is turned on, so the output unit 120-1 outputs a predetermined first voltage, i.e., 12 V.

2) Case in which modulation unit 110 generates a signal having low state
   A base voltage is supplied to the base terminal of the transistor Q2 with low voltage, and a base voltage of the base terminal of the transistor Q1 becomes high. The transistor Q1 is turned off, so the output unit 120-1 outputs a predetermined second voltage, i.e., 0 V.

The specific sizes of the above-mentioned predetermined first and second voltages may be set as other values by considering the specification of a load driven by the receiving unit 200 and the efficiency of communication.

The feedback units 130-1, 130-2 are connected to the output units 120-1, 120-2, respectively, and feedback PWM signals output by the output units 120-1, 120-2 to the transmission controller 140. The transmission controller 140 can determine whether each of PWM signals S1, S2 transmitted to the receiving unit 200 is normal by the operation of the feedback units 130-1, 130-2.

Figure 4:
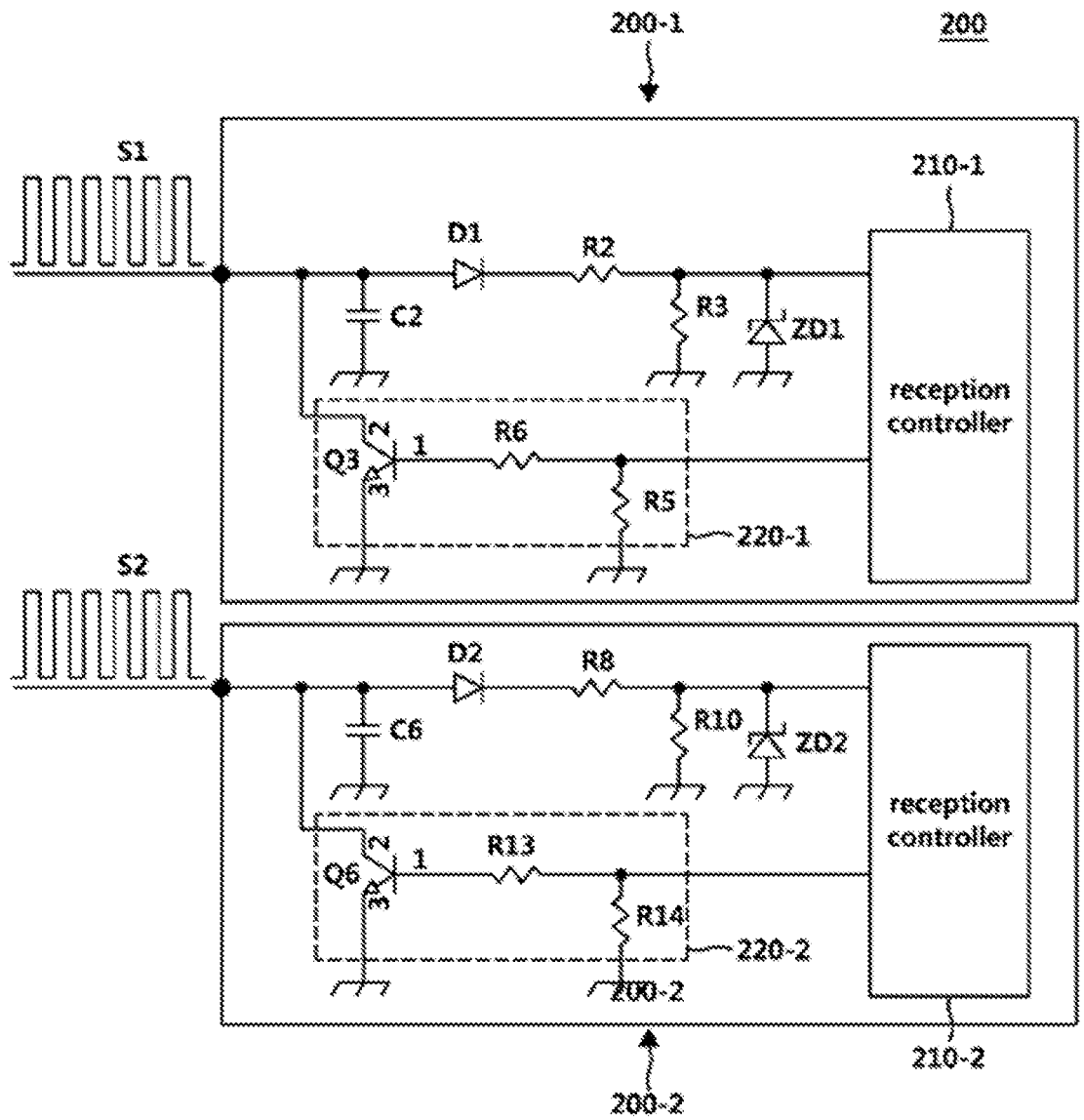
FIG. 4 is a view illustrating an example of structure of two receiving units that receive signals of a transmission unit.

FIG. 4 is a view illustrating an example of structure of two receiving units that receive signals of a transmission unit.

Referring to FIG. 4, a communication system in vehicle 300 according to an example may include two receiving units 200-1, 200-2. Each of the receiving units 200-1, 200-2 receives PWM signals S1, S2 having different duty ratios from a transmission unit 100.

A load to be driven differs for each of the receiving units 200-1, 200-2. For example, the receiving unit 200-1 drives a fan for seat ventilation, and the receiving unit 200-2 drives a heating system of the seat.

The reception controllers 210-1, 210-2 may be implemented with Micro Controller Unit (MCU).

The receiving units 200-1, 200-2 include switching units 220-1, 220-2 to eliminate the influence of communication errors, e.g., a case that PWM signals S1, S2 are abnormal. The switching units 220-1, 220-2 may be implemented to include one switching unit, i.e., transistor.

The reception controllers 210-1, 210-2 may control so that switching units 220-1, 220-2 are maintained as turn-on state or turn-off state depending on whether the PWM signals S1, S2 are normal.

Referring to PWM signal S1 as a reference,
1) If PWM signal S1 is normal
   The reception controller 210-1 drives a load, e.g., a fan for seat ventilation by using the PWM signal S1 received.
2) If PWM signal S1 is abnormal
   In this case, the transmission unit 100 can transmit a PWM signal S1 that remains high for a predetermined time period by the controls based on feedback action. The reception controller 210-1 turns on a transistor Q3 by applying a high voltage to a base terminal 1 in the switching unit 220-1 so that the load is not affected by an abnormal signal S1. When the transistor Q3 is turned on, current flows to an emitter terminal 3 through the transistor Q3, and thus communication line remains low.

The reception controller 210-1 can eliminate the influence that communication error has on load system by maintaining the switching unit 220-1 as turn-on state for a predetermined time period, as above.

The above description is just provided as examples, and the control method of the reception controller 210-1 may vary depending on the implementation of a circuit. In detail, the reception controller 210-1 can prevent the affection of communication error by controlling the switching unit 220-1 to remain turn-on for a predetermined time period.

For the receiving units 200-1, 200-2, communication line remains low by the control actions of the reception controller 210-1 if PWM signals S1, S2 are abnormal. In this case, the transmission unit 100 may be affected. The receiving units 200-1, 200-2 may include rectifier diodes D1, D2 in order to eliminate the influence that the control actions of the reception controller 210-1 have on the transmission unit 100.

Figure 5:
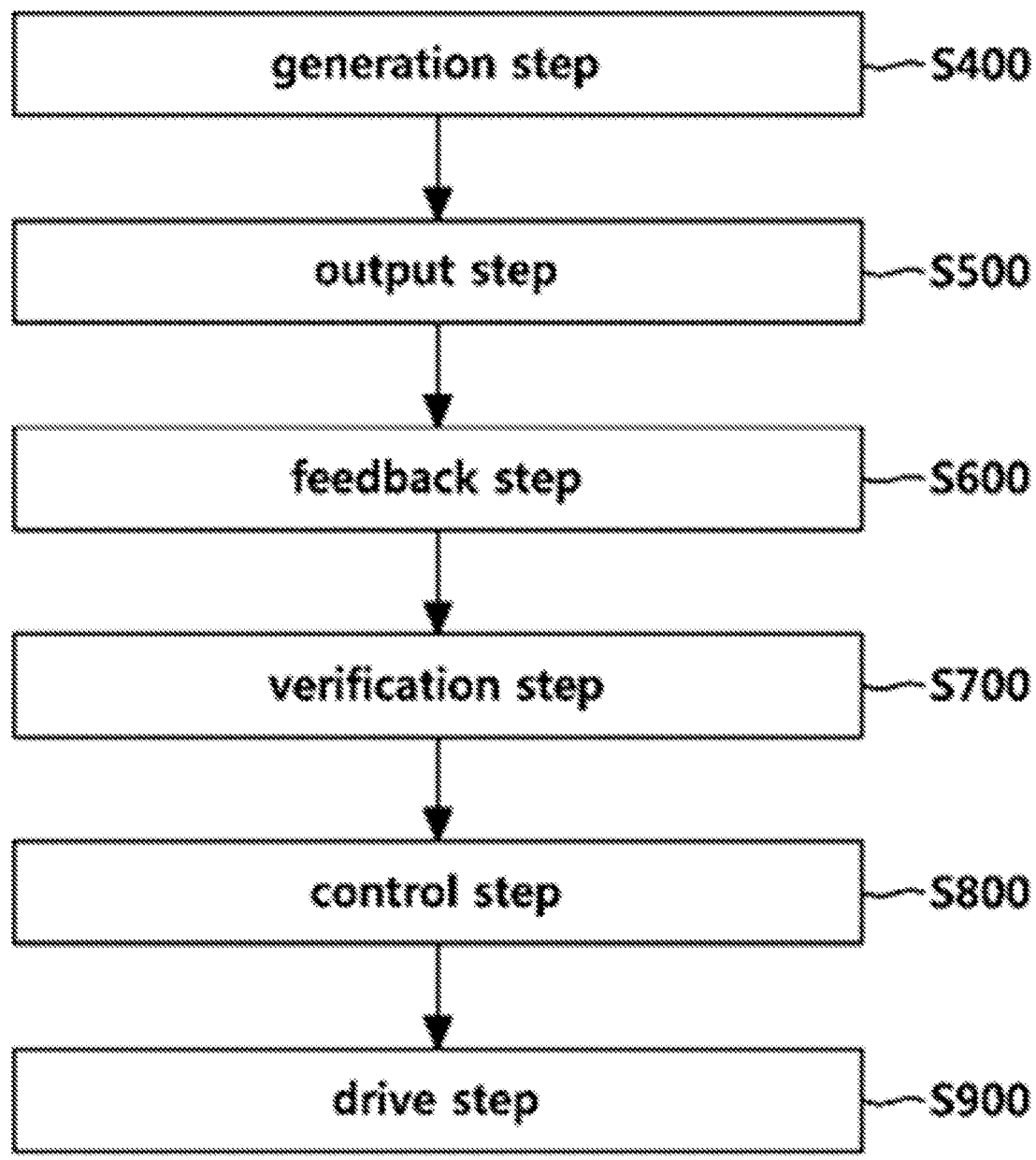
FIG. 5 is a flow chart illustrating an example of a communication method in vehicle.

FIG. 5 is a flow chart illustrating an example of a communication method in vehicle.

Referring to FIG. 5, a communication method in vehicle according to an example includes a generation step S400, an output step S500, a feedback step S600, a verification step S700, and a control step S800.

In generation step S400, a PWM signal having a predetermined duty ratio generates a PWM signal in a modulation unit 110. In detail, the modulation unit 110 can generate a PWM signal having a duty ratio set to control a load driven by a receiving unit 200. If a communication system in vehicle 300 according to an example includes a plurality of receiving units 200, the modulation unit 110 may generate a plurality of PWM signals having different duty ratios.

In output step S500, the output unit 120 outputs the PWM signal. In detail, the output unit 120 implements high and low waveforms using first and second voltages predetermined and outputs PWM signal generated by the modulation unit 110.

In feedback step S600, feedback unit 130 feedbacks the PWM signal output by the output unit 120 to a transmission unit 100 as a previous step for determining whether the PWM signal is normal.

In verification step S700, the normality of the PWM signal is verified using a signal feedbacked by a transmission controller 140. In detail, the transmission controller 140 may determine the PWM signal abnormal if the signal feedbacked by the feedback unit 130 has a duty ratio that is not defined beforehand.

In control step S800, the transmission controller 140 controls the modulation unit 110 based on the verification result.

In detail, the transmission controller 140 controls based on the verification result as follows:

1) If the PWM signal is normal, the transmission controller 140 controls so that the modulation unit 110 maintains to operate. In this case, the original PWM signal is transmitted to the receiving unit 200 as it is.

2) If the PWM signal is abnormal, the transmission controller 140 controls the modulation unit 110 to generate PWM signal that remains high.

A communication method in vehicle according to another example may further include a drive step S900 where a reception controller 210 drives load based on the PWM signal.

In drive step S900, if the PWM signal is abnormal, the reception controller 210 controls so that a switching unit 220 is maintained as a turn-on state for a predetermined time period. If the PWM signal is normal, the reception controller 210 drives a load connected to itself based on the PWM signal.

As above, the communication method in vehicle performs communication using PWM signals, so it is cost-effective as a high-priced MCU supporting CAN/LIN communication is not required.

Also, as control actions are performed by determining whether PWM signals are normal, the operation of a load driven by the receiving unit 200 is not influenced even in case communication errors occur.

The above disclosure has been provided with the aim of method steps indicative of the performance of certain functions and their relationships. The boundaries and order of these functional components and method steps have been arbitrarily defined herein for convenience of description. Alternative boundaries and orders may be defined as long as the specific functions and relationships are properly performed. Any such alternative boundaries and orders are therefore within the scope and spirit of the claimed disclosure.

In addition, the boundaries of these functional components have been arbitrarily defined for ease of explanation. Alternative boundaries may be defined so long as any important functions are performed properly. Likewise, flowchart blocks may also be arbitrarily defined herein to represent any important functionality.

For extended use, the flowchart block boundaries and order may have been defined and still perform some important function. Alternative definitions of both functional components and flowchart blocks and sequences are therefore within the scope and spirit of the claimed disclosure.

The present disclosure may also be described, at least in part, in terms of one or more embodiments. Embodiments of the disclosure are used herein to illustrate the disclosure, aspects thereof, features thereof, concepts thereof, and/or examples thereof. Physical embodiments of an apparatus, article of manufacture, machine, and/or process embodying the present disclosure may include one or more aspects, features, concepts, examples, etc., described with reference to one or more embodiments described herein. It may include.

Moreover, in the entire drawing, embodiments may incorporate the same or similarly named functions, steps, modules, etc. that may use the same or different reference numbers, and as such, the functions. The steps, modules, etc. may be the same or similar functions, steps, modules, etc. or others.

As described above, the present disclosure has been described with reference to specific embodiments such as specific components and limited embodiments and drawings, but this is only provided to help a more general understanding of the present disclosure, the present disclosure is not limited to the above embodiments. For those skilled in the art, various modifications and variations are possible from these descriptions.

Therefore, the spirit of the present disclosure should not be limited to the described embodiments, and all of the equivalents and equivalents of the claims as well as the claims to be described later belong to the scope of the present disclosure.

What is claimed is:

1. A communication system in a vehicle comprising:
   a transmission unit and a receiving unit,
   wherein the transmission unit includes:
      a modulation unit configured to generate a pulse width modulation (PWM) signal having a predetermined duty ratio;
      an output unit configured to output the PWM signal to the receiving unit;
      a feedback unit configured to feedback the PWM signal to a transmission controller of the transmission unit; and
      the transmission controller configured to control the modulation unit by using a feedback signal, and
   wherein the receiving unit includes:
      a reception controller configured to determine whether to drive a load based on the PWM signal output from the output unit; and
      a switching unit including a switch to turn on or turn off based on determination of the reception controller, wherein the PWM signal is normal or abnormal.

2. The communication system of claim 1, when the transmission controller determines that the PWM signal is abnormal,
   the transmission controller controls the modulation unit to generate the PWM signal that remains high for a predetermined time period, and
   the reception controller maintains the switch to be in a turn-on state for the predetermined time period.

3. The communication system of claim 1, wherein,
   the transmission controller determines that the PWM signal is abnormal if the feedback signal has a duty ratio that is not predetermined.

4. The communication system of claim 1, if the transmission controller determines that the receiving unit includes more than one receiving unit,
   the transmission unit generates and transmits a plurality of PWM signals having different duty ratios to each receiving unit.

5. The communication system of claim 1,
   wherein the predetermined duty ratio is set to instruct operation of the load.

6. A method using a communication system in a vehicle, the method comprising:
- generating, by a modulation unit of a transmission unit, a pulse width modulation (PWM) signal having a predetermined duty ratio;
- outputting, by an output unit of the transmission unit, the PWM signal to a receiving unit;
- feedbacking, by a feedback unit of the transmission unit, the PWM signal to a transmission controller of the transmission unit output from the output unit;
- verifying, by the transmission controller of the transmission unit, whether the PWM signal is normal or abnormal using the feedback signal; and
- controlling, by the transmission controller of the transmission unit, the modulation unit based on verification result,
- wherein the verifying includes determining, by the transmission controller, that the PWM signal is abnormal if the feedback signal has a duty ratio that is not predetermined.

7. The method of claim 6, if the PWM signal is abnormal, the transmission controller controls the modulation unit to generate the PWM signal that remains high for a predetermined time period.

8. The method of claim 7, further comprising driving, by a reception controller of the receiving unit, a load based on the PWM signal output from the output unit,
- wherein in the driving, if the PWM signal is abnormal, the reception controller maintains a switch to be in a turn-on state for the predetermined time period.

9. The method of claim 6, wherein the communication system in the vehicle includes a plurality of receiving units, and
- generating the PWM signal includes generating a plurality of PWM signals having different duty ratios to the plurality of receiving units.

10. The method of claim 9, wherein the duty ratios are set to instruct operations of loads driven by the receiving units.

* * * * *